(12) United States Patent
Brodsky et al.

(10) Patent No.: US 7,493,186 B2
(45) Date of Patent: Feb. 17, 2009

(54) METHOD AND ALGORITHM FOR THE CONTROL OF CRITICAL DIMENSIONS IN A THERMAL FLOW PROCESS

(75) Inventors: Colin J. Brodsky, Salt Point, NY (US); Michael M. Crouse, Albany, NY (US); Allen H. Gabor, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 11/613,238

(22) Filed: Dec. 20, 2006

(65) Prior Publication Data

US 2008/0154420 A1    Jun. 26, 2008

(51) Int. Cl.
G06F 19/00    (2006.01)

(52) U.S. Cl. .................. 700/121; 700/119; 438/14

(58) Field of Classification Search .............. 700/97, 700/110, 121; 438/14; 702/155; 216/59, 216/84
See application file for complete search history.

(56) References Cited

U.S. PATENT DOCUMENTS

| | | | | |
|---|---|---|---|---|
| 6,178,360 | B1 * | 1/2001 | Pierrat et al. ............... | 700/121 |
| 6,519,501 | B2 * | 2/2003 | Pierrat et al. ............... | 700/121 |
| 6,614,540 | B1 * | 9/2003 | Stirton ....................... | 356/630 |
| 6,701,206 | B1 * | 3/2004 | Markle et al. ............... | 700/121 |
| 7,012,031 | B2 * | 3/2006 | Choi et al. .................. | 438/14 |
| 7,042,551 | B2 * | 5/2006 | Ausschnitt .................. | 355/55 |
| 7,225,047 | B2 * | 5/2007 | Al-Bayati et al. ........... | 700/121 |
| 7,289,864 | B2 * | 10/2007 | Horak et al. ................. | 700/121 |
| 7,352,439 | B2 * | 4/2008 | Van De Mast et al. ........ | 355/53 |
| 7,369,697 | B2 * | 5/2008 | Starikov ..................... | 382/141 |
| 7,386,420 | B2 * | 6/2008 | Zhang et al. ................ | 702/179 |
| 2002/0155629 | A1 * | 10/2002 | Fairbairn et al. ............. | 438/14 |
| 2003/0139833 | A1 * | 7/2003 | Pierrat et al. ................. | 700/97 |
| 2004/0005507 | A1 * | 1/2004 | Lakkapragada et al. ....... | 430/30 |
| 2005/0085063 | A1 * | 4/2005 | Akram ........................ | 438/616 |
| 2006/0024850 | A1 * | 2/2006 | Monahan et al. ............. | 438/14 |
| 2007/0045230 | A1 * | 3/2007 | Keller et al. .................. | 216/81 |
| 2007/0178699 | A1 * | 8/2007 | Schaller et al. ............. | 438/689 |
| 2007/0187363 | A1 * | 8/2007 | Oka et al. ..................... | 216/59 |
| 2008/0143985 | A1 * | 6/2008 | Mast et al. .................... | 355/53 |

OTHER PUBLICATIONS

Wang et al—"Algorithm for Yield Driven Correction of Layout"—May 2004—Proceedings of the 2004 International Symposium on Circuits and Systems. vol. 5 pp. 241-244.*

* cited by examiner

*Primary Examiner*—Alexander J Kosowski
(74) *Attorney, Agent, or Firm*—Cantor Colburn LLP; Rosa Yaghmour

(57) ABSTRACT

A method of controlling one or more critical dimension (CD) features, dependent upon at least a first and a second processing parameter, with a single metrology step, while still enabling decoupled feedback to the first and the second processing parameter, includes an initial process characterization; producing a production piece; a single metrology step to determine the critical dimensions of the produced features; solving a system of equations simultaneously for individual feedback correction values for the first and second processing parameters; and applying the individual feedback correction values to their respective processing parameters.

12 Claims, 3 Drawing Sheets

US 7,493,186 B2

METHOD AND ALGORITHM FOR THE CONTROL OF CRITICAL DIMENSIONS IN A THERMAL FLOW PROCESS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates generally to semiconductor manufacturing, and more particularly to providing an algorithm and method to determine whether dose, temperature, or both need to be adjusted to achieve a desired critical dimension (CD) for contact holes and vias below the resolution capabilities of the photolithographic process utilizing a post-lithography "reflow" process.

2. Description of the Background

In processes for producing semiconductor devices from a semiconductor wafer, a number of techniques have been developed in order to form circuit patterns on the wafer. One of these processes employs photolithography, which defines the circuit features on a wafer according to a specified pattern or mask. Subsequent manufacturing steps that are used to form a device include chemical and physical film depositions, etching, ion implantation, diffusion, annealing or thermal oxidation. The process for patterning the photoresist is referred to as a photolithography process, which implies first depositing a uniform layer of photoresist or polymeric material onto the substrate, next exposing the photoresist layer to optical illumination through the mask, and then developing the exposed photoresist layer. For example, a UV radiation source (generally either 193 nm, 248 nm or 365 nm wavelength laser-generated radiation—somewhat below the visible spectrum of light) is propagated through a mask to selectively start a photo-chemically initiated reaction in which exposed portions of the coating are rendered soluble to a developer. The combined intensity of the energy multiplied by the time for which it is applied is referred to as the "dose," and is usually expressed in millijoules/cm$^2$. When the developer rinses the coating, it washes away the areas that were exposed, leaving a three-dimensional relief image in the coating. This imaged coating layer is used as a template to selectively perform operations on the exposed substrate. The case described above is for a positive tone resist where the exposed material becomes soluble in developer. If the imaged coating layer or resist becomes insoluble in the irradiated regions it is termed a negative tone resist. The development step may be carried out using wet chemical etching, dry plasma etching or by conversion to a volatile compound through the exposure radiation itself. The exposure radiation may be in the form of visible, deep ultraviolet or x-ray photons, or electron or ion beams of particles. The exposure can be made by a parallel process such as contact or projection printing from a mask, or by serially scanning one or more beams.

Each generation of semiconductor chips has denser circuit patterns with a greater number of devices requiring finer and smaller dimensions. This drive for miniaturization often exceeds the capabilities of the present generation of exposure tools used in the lithographic process that define the circuit geometries. To overcome some of the present limitations of the lithographic process a post-lithography "reflow" process is often employed.

As the dimensions of contact holes and vias decrease below the resolution capabilities of resists, shrink methods such as post-lithography "reflow" are increasingly being used to achieve the desired contact hole sizes. One of the more promising shrink techniques is thermal flow where after imaging a hole, the hole is shrunk to the final target size by heating the wafer above the flow temperature of the resist material. Through proper materials design of the resist, it is possible to induce a controlled "melt" of the material that shrinks the hole size to a desired target dimension. Although we discuss the shrinking of holes, other types of spaces in resist can also be shrunk. These can include elongated holes or trenches.

FIGS. 1A and 1B illustrate post-lithography "reflow" to form a reduced hole feature. The initial exposure dose in the lithographic process defines the image size (H, W) of the hole feature 100 in FIG. 1A. In FIG. 1B, the final image size (H', W') of the hole feature 100' is defined by the combination of the exposure dose of the initial image of FIG. 1A, followed by a temperature profile applied to reflow the hole feature 100 to the dimensions of hole feature 100'. A simple temperature profile would include the ramp rate up to the flow temperature, the dwell time at the flow temperature and ramp rate down to room temperature. More complicated temperature profiles can also be used. For a typical positive tone resist system, increasing the exposure dose with a given mask results in larger hole widths (W). Conversely, increasing the temperature during reflow will result in a reduced hole width (W') through the reflow step.

A critical aspect of the post-lithography "reflow" is process control. Both the dose and temperature responses are known to vary over time and require regular feedback control. An obvious solution would be to simply measure the first image formed during the lithographic process (dose), provide feedback for a new dose for subsequent lots, and feed-forward the critical dimension (CD) error to pre-correct the reflow process accordingly to compensate. However, this approach to process control has significant drawbacks. First, the measurement of these critical dimensions (CD) is time consuming. Second, CD metrology in modern semiconductor manufacturing processes is performed with specialized scanning electron microscope tools, and would require stopping the process following exposure and development to obtain the developed image, by removing the wafer and placing it in the microscope. After the CD metrology is completed the wafer would then be returned back to the lithography tool (where lithography tool refers to the "track" where the post expose processing occurs) to perform the final reflow step. The additional handling and moving of the wafer can introduce additional potential defects to the process.

Simply measuring the final CD after flow is also unsuitable as there are two potential sources of error, both of which are equally important to control, and measuring a single arbitrary feature as is done in the current art is inadequate to separate and determine the impact of the two potential sources of error—dose and temperature. This shortcoming can be seen in current CD control algorithms, which adjust dose alone even though the CD error could have come from a change in the flow characteristics of the resist. Specifically, if the CD is off target due to a difference in the flow temperature point of a new batch of resists, the current CD correction algorithm will incorrectly adjust the dose to try to compensate.

FIG. 3 illustrates the current process of two separate CD metrology steps (306, 310) to independently quantify feedback to both exposure (dose)/image development process 304 and thermal reflow (temperature) process 308, respectively, after a one-time initial process characterization 300 is defined for incoming product 302. If the CD is at its target value 312, the wafer is considered done 314 and proceeds further within the manufacturing process. However, if the CD is not at it target value 312, the image is stripped from the wafer, and the process of re-imaging the wafer 304, and carrying out the post-lithography "reflow" 308 is repeated with the feedback correction values.

SUMMARY OF THE INVENTION

Embodiments of the present invention include a method of controlling one or more critical dimension (CD) features, dependent upon at least a first and a second processing parameter, with a single metrology step, while still enabling decoupled feedback to the first and the second processing parameter. The method comprises: an initial process characterization comprising the steps of: determining a first CD feature; determining a second CD feature; defining a first target dimension value ($Tgt_1$) for the first CD feature; defining a second target dimension value ($Tgt_2$) for the second CD feature; characterizing a rate of change ($\Delta_{11}$) for the first CD feature in response to the first processing parameter in a test piece; characterizing a rate of change ($\Delta_{21}$) for the second CD feature in response to the first processing parameter in the test piece; characterizing a rate of change ($\Delta_{12}$) for the first CD feature in response to the second processing parameter in the test piece; characterizing a rate of change ($\Delta_{22}$) for the second CD feature in response to the second processing parameter in the test piece; and the method further comprises producing a production piece and forming the first CD feature and second CD feature in the production piece; and performing the single metrology step by measuring the first CD feature ($CD_1$) and second CD feature ($CD_2$) after their forming in the production piece; defining a first variable (x) to represent a first unknown correction value for the first processing parameter; defining a second variable (y) to represent a second unknown correction value for the second processing parameter; defining a first equation as $CD_1 = T_{gt1} + (\Delta_{11})(x) + (\Delta_{12})(y)$; defining a second equation as $CD_2 = T_{gt2} + (\Delta_{21})(x) + (\Delta_{22})(y)$; solving the first equation and the second equation simultaneously to determine the first variable and the second variable; and providing the decoupled feedback by: assigning the determined value for the first variable to the first unknown correction value and applying it as feedback to the first processing parameter; and assigning the determined value for the second variable to the second unknown correction value and applying it as feedback to the second processing parameter.

A method of controlling one or more critical dimension (CD) features, of photoresist geometries generated by photolithographic process and a post-lithography reflow process that are dependent upon exposure dose and flow temperature respectively, with a single metrology step, while still enabling decoupled feedback to correct exposure dose and flow temperature. The method includes: an initial process characterization comprising the steps of: determining a first CD feature; determining a second CD feature; defining a first target dimension value ($Tgt_1$) for the first CD feature; defining a second target dimension value ($Tgt_2$) for the second CD feature; characterizing a CD vs. dose slope ($DS_1$) for the first CD feature in response to the exposure dose applied to a test piece; characterizing a CD vs. dose slope ($DS_2$) for the second CD feature in response to the dose applied to the test piece; characterizing a CD vs. thermal slope ($TS_1$) for the first CD feature in response to the flow temperature applied to the test piece; characterizing a thermal slope ($TS_2$) for the second CD feature in response to the flow temperature applied to the test piece; and the method further comprises producing a production piece and forming the first CD feature and second CD feature in the production piece; and performing the single metrology step by measuring the first CD feature ($CD_1$) and second CD feature ($CD_2$) after being formed in the production piece; defining a first variable (x) to represent a first unknown correction value for the exposure dose; defining a second variable (y) to represent a second unknown correction value for the flow temperature; defining a first equation as $CD_1 = T_{gt1} + (DS_1)(x) + (TS_1)(y)$; defining a second equation as $CD_2 = T_{gt2} + (DS_2)(x) + (TS_2)(y)$; solving the first equation and the second equation simultaneously to determine the first variable and the second variable; and wherein the method further comprises providing the decoupled feedback by: assigning the determined value for the first variable to the first unknown correction value and apply it as feedback to the exposure dose; and assigning the determined value for the second variable to the second unknown correction value and applying it as feedback to the flow temperature.

An article comprising machine-readable storage media containing instructions is also provided that when executed by a processor enables the processor to execute an algorithm for controlling one or more critical dimension (CD) features, dependent upon at least a first and a second processing parameter, with a single metrology step, while still enabling decoupled feedback to the first and the second processing parameter, said algorithm having input parameters comprising: a first target dimension value ($Tgt_1$) for a first CD feature; a second target dimension value ($Tgt_2$) for a second CD feature; a rate of change ($\Delta_{11}$) for the first CD feature in response to the first processing parameter in a test piece; a rate of change ($\Delta_{21}$) for the second CD feature in response to the first processing parameter in the test piece; a rate of change ($\Delta_{12}$) for the first CD feature in response to the second processing parameter in the test piece; a rate of change ($\Delta_{22}$) for the second CD feature in response to the second processing parameter in the test piece; a dimension $CD_1$ that represents the measured value of the first CD feature in a production piece; a dimension $CD_2$ that represents the measured value of the second CD feature in a production piece; The algorithm further comprises: a first variable (x) to represent a first unknown correction value for the first processing parameter; a second variable (y) to represent a second unknown correction value for the second processing parameter; a first equation defined as $CD_1 = T_{gt1} + (\Delta_{11})(x) + (\Delta_{12})(y)$; a second equation defined as $CD_2 = T_{gt2} + (\Delta_{21})(x) + (\Delta_{22})(y)$; and solving the first equation and the second equation simultaneously to determine the first variable and the second variable; implementing decoupled feedback by: assigning the determined value for the first variable to the first unknown correction value and applying it as feedback to the first processing parameter; and assigning the determined value for the second variable to the second unknown correction value and applying it as feedback to the second processing parameter.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, a solution is technically achieved in which an algorithm is employed to determine whether dose, temperature, or both need to be adjusted to achieve a correct critical dimension (CD) for contact holes and vias below the resolution capabilities of the photolithographic process utilizing a post-lithography "reflow" process. The process of the present invention eliminates a CD metrology step, while still enabling decoupled feedback to both the exposure (dose) and reflow (temperature) during wafer fabrication.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF SPECIFIC EMBODIMENTS

Embodiments of the present invention provide an algorithm and method for the control of critical dimensions (CD) of contact holes, vias, and other features. The algorithm determines whether the dose, temperature, or both need to be adjusted to achieve contact holes, vias, and other features having the correct CD following a post-lithography "reflow" process. The embodiments of the present invention rely on characterizing the process sensitivity to flow temperature and dose by identifying structures that behave differently so that the algorithm can determine whether to adjust dose, temperature, or both. An additional advantage of the present invention is the elimination of the need for two metrology and two track processing steps. The embodiments of the present invention are described in terms of thermal flow, but the present invention could also be used for other processes where multiple steps lead to a final CD that requires measurement and feedback corrections. In addition, features more sensitive to dose other than a contact hole or via may be used. For example, the distance between line-ends, which have a larger response to dose variation, can be used to determine the correction factors.

Figure 1A:
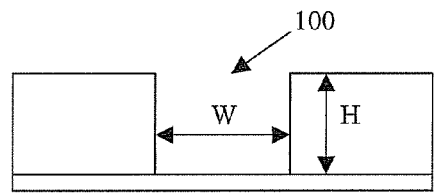
FIGS. 1A and 1B are a sequence of cross sectional views illustrating the lithographic image CD limit, and the sub-resolution CD achieved with resist (polymer reflow), respectively.
Figure 1B:
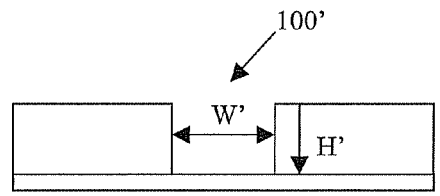
Figure 2:
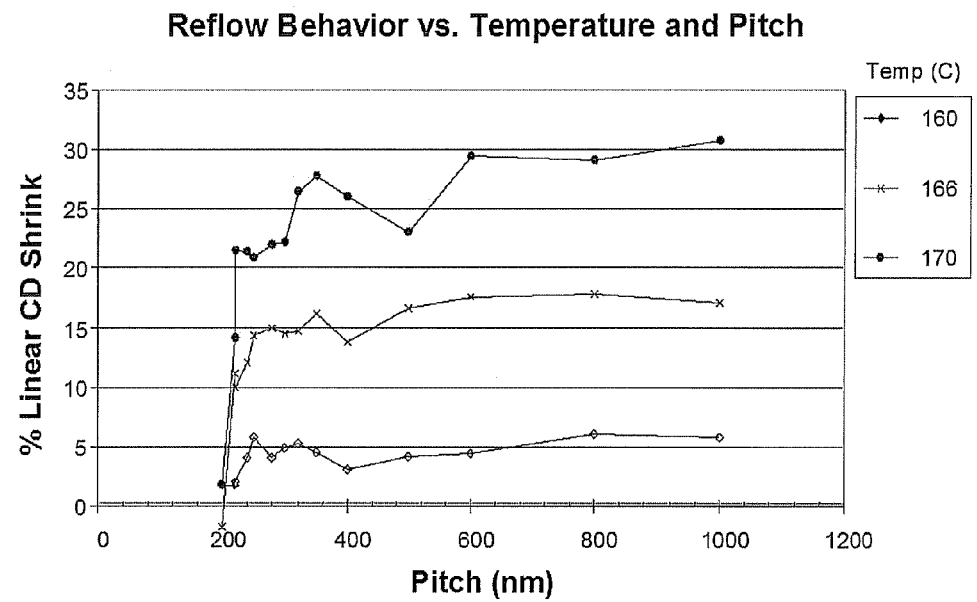
FIG. 2 is a chart that illustrates the degree of CD shrink as a function of pitch and temperature.

The algorithm of an embodiment of the present invention exploits a fundamental behavior of the post-lithography reflow process, in which closely spaced features such as holes do not change CD at the same rate as isolated features during the reflow step. FIG. 2 illustrates this behavior.

The chart of FIG. 2 illustrates the degree of CD shrink as a function of pitch and temperature. Pitch defines the spacing between centers of the features patterned during the exposure/develop step. For example, a 100 nm diameter contact hole on a 200 nm pitch has 100 nm of resist between each hole. This is considered a "nested" or tightly placed structure. As can be seen, a hole with a 200 nm pitch changes less than 2% when the temperature is changed from 160° C. to 170° C. Conversely, over the same temperature range the hole at 1000 nm pitch changes up to 30%. A similar characterization may be performed to determine the rate of change for the initial CD as a function of exposure dose.

Utilizing the pitch and temperature relationship, and having selected an isolated target (feature 1) and nested target (feature 2) designed to exploit the difference in behavior illustrated in FIG. 2, a control algorithm that can separate both a dose and temperature error correction values from one CD SEM (scanning electron microscope) metrology operation can be derived by solving a simultaneous set of equations (Table 2), with the characterization variables and measured variables of table. Plugging in the values of table 1 in the equations 3 and 4 yields a dose error of x=2 mJ, and a thermal error of y=1° C.

TABLE 1

| Characterized Variables: | $DS_1$ = Dose Slope 1 | 2 nm/mJ |
|---|---|---|
| | $DS_2$ = Dose Slope 2 | 4 nm/mJ |
| | $TS_1$ = Thermal Slope 1 | 3 nm/mJ |
| | $TS_2$ = Thermal Slope 2 | 5 nm/mJ |
| Measured Variables: | $CD_1$ = CD for feature 1 | 107 nm |
| | $CD_2$ = CD for feature 2 | 113 nm |
| Target Values: | $Tgt_1$ = Target for feature 1 | 100 nm |
| | $Tgt_2$ = Target for feature 2 | 100 nm |
| Unknown Values: | x = Dose error | |
| | y = Thermal error | |

TABLE 2

| | |
|---|---|
| $CD_1 = Tgt_1 + (DS_1)(x) + (TS_1)(y)$ | Equation 1 |
| $CD_2 = Tgt_2 + (DS_2)(x) + (TS_2)(y)$ | Equation 2 |
| $y = \dfrac{CD_2 - Tgt_2 - (DS_2)(x)}{TS_2}$ | Equation 3 |
| $x = \dfrac{CD_1 - Tgt_1 - (TS_1)\left(\dfrac{CD_2 - Tgt_2 - (DS_2)(x)}{TS_2}\right)}{DS_1}$ | Equation 4 |

Figure 3:
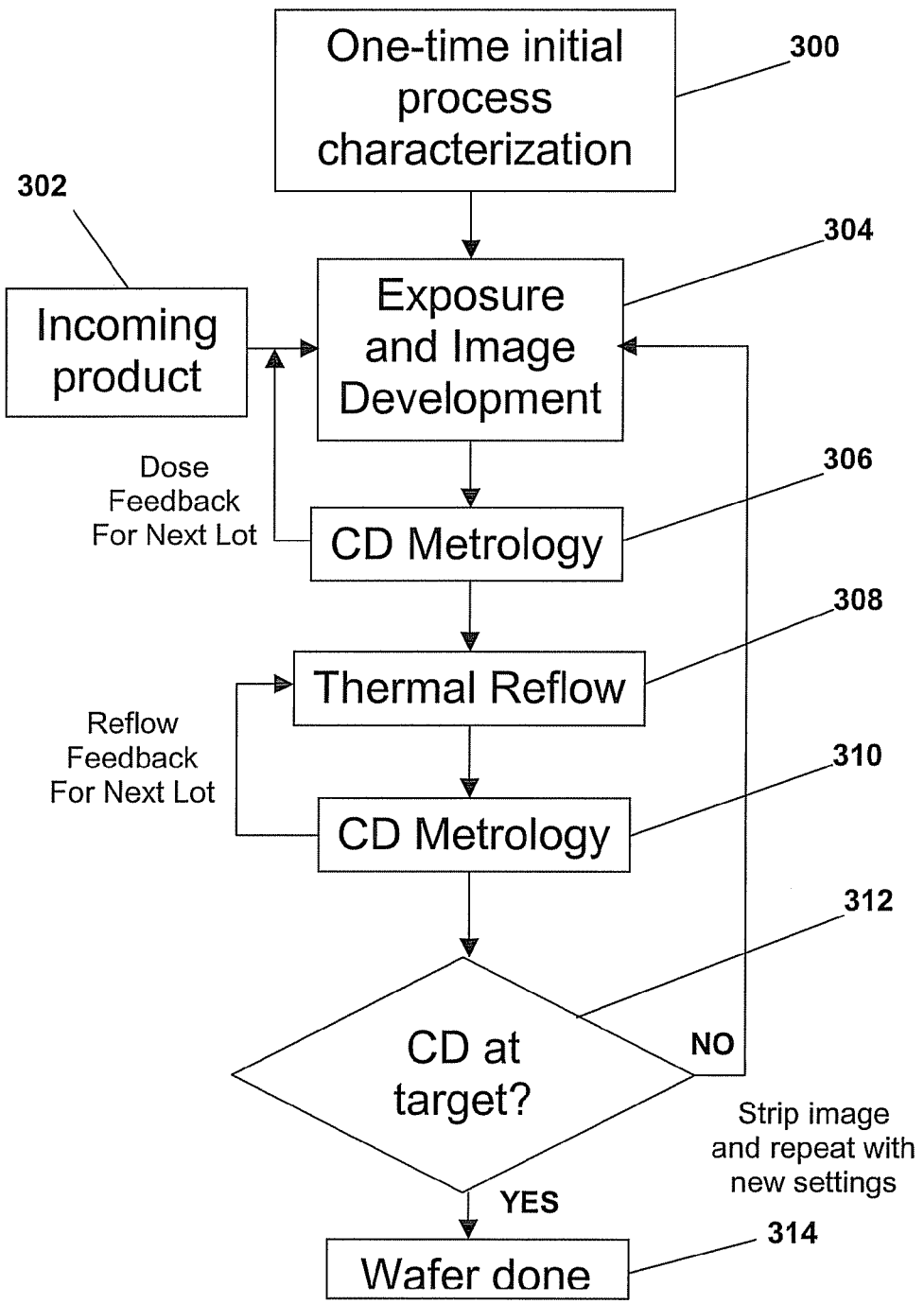
FIG. 3 is a chart that illustrates a current manufacturing process that employs two separate CD metrology steps to independently quantify feedback to both the exposure and reflow steps.
Figure 4:
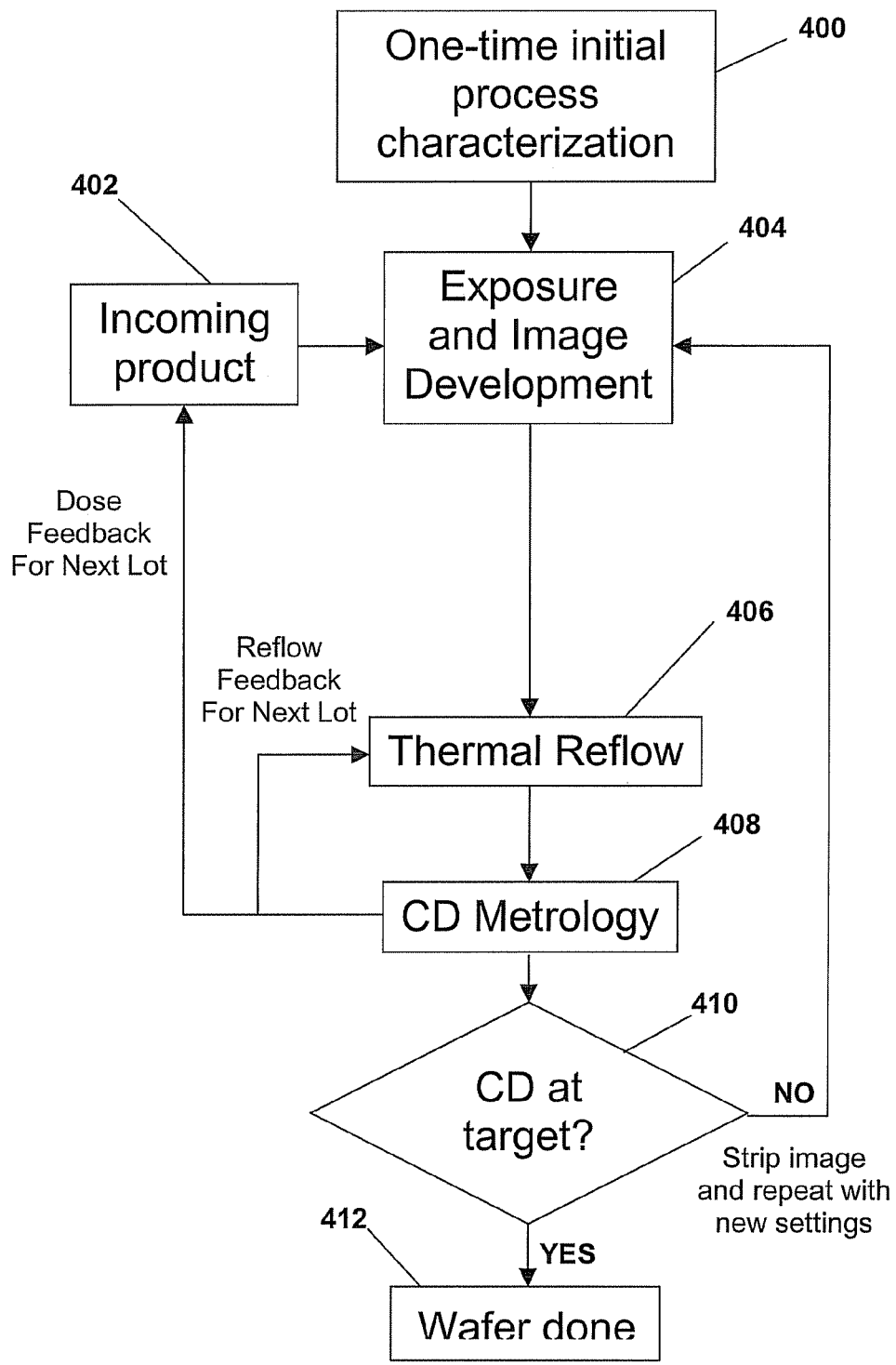
FIG. 4 is a chart that illustrates a manufacturing process that employs a single CD metrology step to quantify feedback to both the exposure and reflow steps according to an embodiment of the present invention.

FIG. 4 illustrates a process of an embodiment of the present invention were a single CD metrology step 408 to independently quantify feedback to both exposure (dose)/image development process 404 and thermal reflow (temperature) process 406, after a one-time initial process characterization 400 is defined for incoming product 402. In contrast to FIG. 3, where there is an intervening metrology step 306 between exposure (dose)/image development 304 and thermal reflow 308, the process of the present invention proceeds directly from exposure (dose)/image development 404 to thermal reflow 406 and eliminates the intervening metrology step, with a single metrology step 408 performed following the thermal reflow 406. If the CD is at its target value 410, the wafer is considered done 412 and proceeds further within the manufacturing process. However, if the CD is not at it target value 410, the image is stripped from the wafer, and the process of re-imaging the wafer 404, and carrying out the post-lithography "reflow" 406 is repeated with the error corrections (dose and reflow feedback).

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of controlling one or more critical dimension (CD) features, dependent upon at least a first and a second processing parameter, with a single metrology step, while still enabling decoupled feedback to the first and the second processing parameter, said method comprising:

an initial process characterization, the initial process characterization further comprising:
  determining a first CD feature;
  determining a second CD feature;
  defining a first target dimension value ($Tgt_1$) for the first CD feature;
  defining a second target dimension value ($Tgt_2$) for the second CD feature;
  characterizing a rate of change ($\Delta_{11}$) for the first CD feature in response to the first processing parameter in a test piece;
  characterizing a rate of change ($\Delta_{21}$) for the second CD feature in response to the first processing parameter in the test piece;
  characterizing a rate of change ($\Delta_{12}$) for the first CD feature in response to the second processing parameter in the test piece;
  characterizing a rate of change ($\Delta_{22}$) for the second CD feature in response to the second processing parameter in the test piece; and
producing a production piece following the initial process characterization, further comprising:
  forming the first CD feature and second CD feature in the production piece;
  performing the single metrology step following the completion of producing the production piece, wherein the single metrology step further comprises:
    measuring the first CD feature ($CD_1$) and second CD feature ($CD_2$);
    defining a first variable (x) to represent a first unknown correction value for the first processing parameter;
    defining a second variable (y) to represent a second unknown correction value for the second processing parameter;
    defining a first equation as $CD_1 = T_{gt1} + (\Delta_{11})(x) + (\Delta_{12})(y)$;
    defining a second equation as $CD_2 = T_{gt2} + (\Delta_{21})(x) + (\Delta_{22})(y)$; and
    solving the first equation and the second equation simultaneously to determine the first variable and the second variable;
  implementing the decoupled feedback by:
    assigning the determined value for the first variable to the first unknown correction value and applying it as feedback to the first processing parameter; and
    assigning the determined value for the second variable to the second unknown correction value and applying it as feedback to the second processing parameter.

2. The method of claim 1 wherein the feedback values for the first processing parameter and the second processing parameter are obtained with a single metrology step.

3. The method of claim 1 wherein the one or more CD features are photoresist geometries produced in a photolithographic process.

4. The method of claim 3 wherein the first process parameter is an exposure dose applied during the photolithographic process.

5. The method of claim 3 wherein the second process parameter is flow temperature applied during a post-photolithographic reflow.

6. A method of controlling one or more critical dimension (CD) features, of photoresist geometries generated by photolithographic process and a post-lithography reflow process that are dependent upon exposure dose and flow temperature respectively, with a single metrology step, while still enabling decoupled feedback to correct exposure dose and flow temperature, said method comprising:

an initial process characterization, the initial process characterization further comprising:
  determining a first CD feature;
  determining a second CD feature;
  defining a first target dimension value ($Tgt_1$) for the first CD feature;
  defining a second target dimension value ($Tgt_2$) for the second CD feature;
  characterizing a dose slope ($DS_1$) for the first CD feature in response to the exposure dose applied to a test piece;
  characterizing a dose slope ($DS_2$) for the second CD feature in response to the dose applied to the test piece;
  characterizing a thermal slope ($TS_1$) for the first CD feature in response to the flow temperature applied to the test piece;
  characterizing a thermal slope ($TS_2$) for the second CD feature in response to the flow temperature applied to the test piece; and
producing a production piece following the initial process characterization, further comprising:
  forming the first CD feature and second CD feature in the production piece;
  performing the single metrology step following the completion of producing the production piece, wherein the single metrology step further comprises:
    measuring the first CD feature ($CD_1$) and second CD feature ($CD_2$);
    defining a first variable (x) to represent a first unknown correction value for the exposure dose;

defining a second variable (y) to represent a second unknown correction value for the thermal energy;

defining a first equation as $CD_1 = T_{gt1} + (DS_1)(x) + (TS_1)(y)$;

defining a second equation as $CD_2 = T_{gt2} + (DS_2)(x) + (TS_2)(y)$; and solving the first equation and the second equation simultaneously to determine the first variable and the second variable;

implementing the decoupled feedback by:

assigning the determined value for the first variable to the first unknown correction value and applying it as feedback to the exposure dose; and assigning the determined value for the second variable to the second unknown correction value and applying it as feedback to the flow temperature.

7. The method of claim 6 wherein the feedback values for the exposure dose and the flow temperature are obtained with a single metrology step.

8. An article comprising machine-readable storage media containing instructions that when executed by a processor enables the processor to execute an algorithm for controlling one or more critical dimension (CD) features, dependent upon at least a first and a second processing parameter, with a single metrology step, while still enabling decoupled feedback to the first and the second processing parameter, said algorithm further comprising:

receiving a first target dimension input value ($Tgt_1$) for a first CD feature;

receiving a second target dimension input value ($Tgt_2$) for a second CD feature;

receiving a rate of change ($\Delta_{11}$) input for the first CD feature in response to the first processing parameter in a test piece;

receiving a rate of change ($\Delta_{21}$) input for the second CD feature in response to the first processing parameter in the test piece;

receiving a rate of change ($\Delta_{12}$) input for the first CD feature in response to the second processing parameter in the test piece;

receiving a rate of change ($\Delta_{22}$) input for the second CD feature in response to the second processing parameter in the test piece;

receiving a dimension $CD_1$ input value that represents the measured value of the first CD feature in a production piece;

receiving a dimension $CD_2$ input value that represents the measured value of the second CD feature in a production piece; and simultaneously solving a first equation and a second equation so as to generate a first output (x) which represents a first correction value for the first processing parameter, and a second output (y) which represents a second correction value for the second processing parameter, wherein the first equation is defined by $CD_1 = T_{gt1} + (\Delta_{11})(x) + (\Delta_{12})(y)$, and the second equation is defined by $CD_2 = T_{gt2} + (\Delta_{21})(x) + (\Delta_{22})(y)$;

wherein the first and second outputs comprise decoupled feedback for respective application to the first and second processing parameters.

9. The article of claim 8 wherein the feedback values for the first processing parameter and the second processing parameter are obtained with a single metrology step.

10. The article of claim 8 wherein the one or more CD features are photoresist geometries produced in a photolithographic process.

11. The article of claim 8 wherein the first process parameter is an exposure dose applied during the photolithographic process.

12. The article of claim 8 wherein the second process parameter is thermal energy applied during a post-photolithographic reflow.

* * * * *